United States Patent
Mitsuda et al.

(10) Patent No.: US 8,890,603 B2
(45) Date of Patent: Nov. 18, 2014

(54) OUTPUT CIRCUIT

(71) Applicant: Fujitsu Semiconductor Limited, Yokohama (JP)

(72) Inventors: Kazuhiro Mitsuda, Nagoya (JP); Shinji Miyata, Nagoya (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 13/864,956

(22) Filed: Apr. 17, 2013

(65) Prior Publication Data

US 2013/0300494 A1 Nov. 14, 2013

(30) Foreign Application Priority Data

Apr. 19, 2012 (JP) .................. 2012-095484

(51) Int. Cl.
- H03K 3/01 (2006.01)
- H03K 17/687 (2006.01)
- H03K 19/0175 (2006.01)
- G05F 3/20 (2006.01)

(52) U.S. Cl.
CPC ...... *H03K 17/687* (2013.01); *H03K 19/017509* (2013.01); *G05F 3/205* (2013.01)
USPC ............................ 327/534; 327/108; 327/540

(58) Field of Classification Search
CPC ..... G05F 3/205; G05F 3/242; H03K 19/0027; H03K 17/302
See application file for complete search history.

(56) References Cited

U.S. PATENT DOCUMENTS

| | | | | |
|---|---|---|---|---|
| 4,728,825 A * | 3/1988 | Sugayama et al. | ............ | 327/434 |
| 5,631,579 A | 5/1997 | Miki et al. | | |
| 5,689,144 A * | 11/1997 | Williams | ........................ | 307/130 |
| 5,808,954 A * | 9/1998 | Ichikawa | ........................ | 365/226 |
| 5,966,044 A * | 10/1999 | Naka | .............................. | 327/535 |
| 5,973,530 A * | 10/1999 | Morris et al. | ................... | 327/210 |
| 6,118,301 A * | 9/2000 | Singh et al. | ....................... | 326/58 |
| 6,400,191 B2 * | 6/2002 | Kawano et al. | ................ | 327/112 |
| 6,441,593 B1 * | 8/2002 | Saripella | ........................ | 323/268 |
| 6,590,440 B1 * | 7/2003 | Williams et al. | ............... | 327/396 |
| 6,650,164 B2 * | 11/2003 | Kondo | ........................... | 327/309 |
| 6,859,089 B2 * | 2/2005 | Farley | ............................ | 327/427 |
| 6,953,971 B2 * | 10/2005 | Laville et al. | .................. | 257/363 |
| 7,493,505 B2 * | 2/2009 | Leung | ............................ | 713/323 |
| 7,560,971 B2 * | 7/2009 | Heikkila et al. | ............... | 327/333 |
| 7,683,696 B1 * | 3/2010 | Le | .................................. | 327/534 |
| 8,114,745 B2 * | 2/2012 | Wu et al. | ........................ | 438/294 |
| 8,116,051 B2 * | 2/2012 | Nakahara | ......................... | 361/84 |
| 8,164,378 B2 * | 4/2012 | Pietri et al. | ..................... | 327/534 |
| 8,351,172 B2 * | 1/2013 | Nakahara | ......................... | 361/84 |

(Continued)

FOREIGN PATENT DOCUMENTS

| | | |
|---|---|---|
| JP | 05-067778 A | 3/1993 |
| JP | 08-148986 A | 6/1996 |

*Primary Examiner* — Thomas J Hiltunen
(74) *Attorney, Agent, or Firm* — Arent Fox LLP

(57) ABSTRACT

An output circuit includes a current source and a first MOS transistor coupled in series between a power supply terminal and an output terminal. The first MOS transistor includes a backgate coupled to a drain of the second MOS transistor. The second MOS transistor includes a source coupled to a source of a third MOS transistor. The second MOS transistor includes a source coupled to backgates of the second and third MOS transistors. The backgates of the second and third MOS transistors are in a floating condition.

8 Claims, 11 Drawing Sheets

(56) References Cited

U.S. PATENT DOCUMENTS

| | | | |
|---|---|---|---|
| 8,432,144 B2* | 4/2013 | Notani | 323/280 |
| 8,446,185 B2* | 5/2013 | Nakahara | 327/108 |
| 8,570,096 B2* | 10/2013 | Le Coz et al. | 327/534 |
| 2008/0068050 A1* | 3/2008 | Ajit | 327/108 |
| 2010/0007999 A1* | 1/2010 | Iwata | 361/18 |
| 2011/0012672 A1* | 1/2011 | Ogawa | 327/537 |
| 2014/0084378 A1* | 3/2014 | Harada et al. | 257/369 |

* cited by examiner

OUTPUT CIRCUIT

CROSS-REFERENCE TO RELATED APPLICATIONS

This application is based upon and claims the benefit of priority from prior Japanese Patent Application No. 2012-095484, filed on Apr. 19, 2012, the entire contents of which are incorporated herein by reference.

FIELD

The present disclosure relates to an output circuit.

BACKGROUND ART

In the field of semiconductor integrated circuit devices, multiple semiconductor devices having predetermined functions are often coupled to one another with a bus instead of using a single semiconductor device having multiple functions. To transmit information between such semiconductor devices, each semiconductor device includes an output circuit that outputs signals (refer to, for example, Japanese Laid-Open Patent Publication No. 8-148986).

SUMMARY

FIG. 11 illustrates a referential example of a semiconductor integrated circuit device. The semiconductor integrated circuit device includes a plurality of semiconductor devices 110A and 110B, which are coupled to a bus B1. Each of the semiconductor devices 110A and 110B includes an output circuit 111. The semiconductor device 110A operates on a first high-potential power supply voltage VDD1 (e.g., 5 V). The semiconductor device 110B operates on a second high-potential power supply voltage VDD2 (e.g., 3.3 V). The output circuit 111 arranged in the semiconductor device 110A will now be described.

The output circuit 111 includes a buffer circuit 120 and an output stage 130 coupled to the buffer circuit 120. The buffer circuit 120 provides the output stage 130 with a voltage determined in accordance with an input signal Vin, which is provided from an internal circuit (not illustrated) of the semiconductor device 110A. The output stage 130 provides an output signal Vout to an output terminal To of the output circuit 111. The buffer circuit 120 is a source-follower circuit that includes a P-channel metal oxide semiconductor (MOS) transistor TP21, functioning as a current source, and a P-channel MOS transistor TP22 coupled to the transistor TP21. The transistor TP22 has a drain coupled to a power supply terminal T2, which is provided with a low-potential power supply voltage GND. The transistor TP22 has a gate provided with the input signal Vin. The transistor TP22 has a source coupled to the output stage 130.

The output stage 130 is a source-follower circuit that includes a P-channel MOS transistor TP23, functioning as a current source, and an N-channel MOS transistor TN21 coupled to the transistor TP23. The transistor TN21 has a drain coupled via the transistor TP23 to a power supply terminal T1, which is provided with a high-potential power supply voltage VDD1. The transistor TN21 has a gate coupled to the source of the transistor TP22. The transistor TN21 has a source coupled to the output terminal To. The output circuit 111 outputs an output signal Vout in accordance with the input signal Vin. For example, the output circuit 111 outputs an output signal Vout having substantially the same level as the input signal Vin from the output terminal To to the bus B1.

The transistor TN21 has a backgate coupled to the power supply terminal T2 to prevent current from flowing from the bus B1 through the transistors TN21 and TP23 to the power supply terminal T1 when the potential at the bus B1 becomes higher than the first high-potential power supply voltage VDD1 of the output circuit 111.

In the output circuit 111 illustrated in FIG. 11, the backgate of the transistor TN21 is coupled to the power supply terminal T2. Thus, when the power supply terminal T2 of the semiconductor device 110A is unintentionally disconnected from a power supply line at a low-potential side, shortcomings may occur. For example, when the power supply terminal T2 of the semiconductor device 110A is disconnected from such a power supply line, the DC current in the semiconductor device 110A raises the potential at the power supply terminal T2 of the semiconductor device 110A to the same level as the first high-potential power supply voltage VDD1. When the other semiconductor device 110B outputs, for example, a signal with a second high-potential power supply voltage VDD2 under this situation, a large current will flow to the bus B1 from the power supply terminal T2 of the semiconductor device 110A through the backgate of the transistor TN21. In detail, a parasitic diode D21 having a forward direction from the backgate to the source of the transistor TN21 is formed between the source and the backgate of the transistor TN21. When a voltage having a potential (second high-potential power supply voltage VDD2 in this example) lower than the potential at the power supply terminal T2 (first high-potential power supply voltage VDD1 in this example), which is the backgate voltage, is applied to the source of the transistor TN21, a large current will flow to the bus B1 from the power supply terminal T2 through the parasitic diode D21. Such a current may cause an erroneous operation of the other semiconductor device no.

An output circuit according to one aspect of the present disclosure includes a current source and a first MOS transistor coupled in series between a power supply terminal and an output terminal, a second MOS transistor including a drain coupled to a backgate of the first MOS transistor, and a third MOS transistor including a source coupled to a source of the second MOS transistor. A backgate of each of the second MOS transistor and the third MOS transistor are coupled to a source of the second MOS transistor, and the backgates of the second MOS transistor and the third MOS transistor are in a floating condition.

The object and advantages of the invention will be realized and attained by means of the elements and combinations of particularly pointed out in the claims. It is to be understood that both the foregoing general description and the following detailed description are exemplary and explanatory and are not restrictive of the invention.

DESCRIPTION OF EMBODIMENTS

A first embodiment will now be described with reference to FIGS. 1 to 5.

Figure 3:
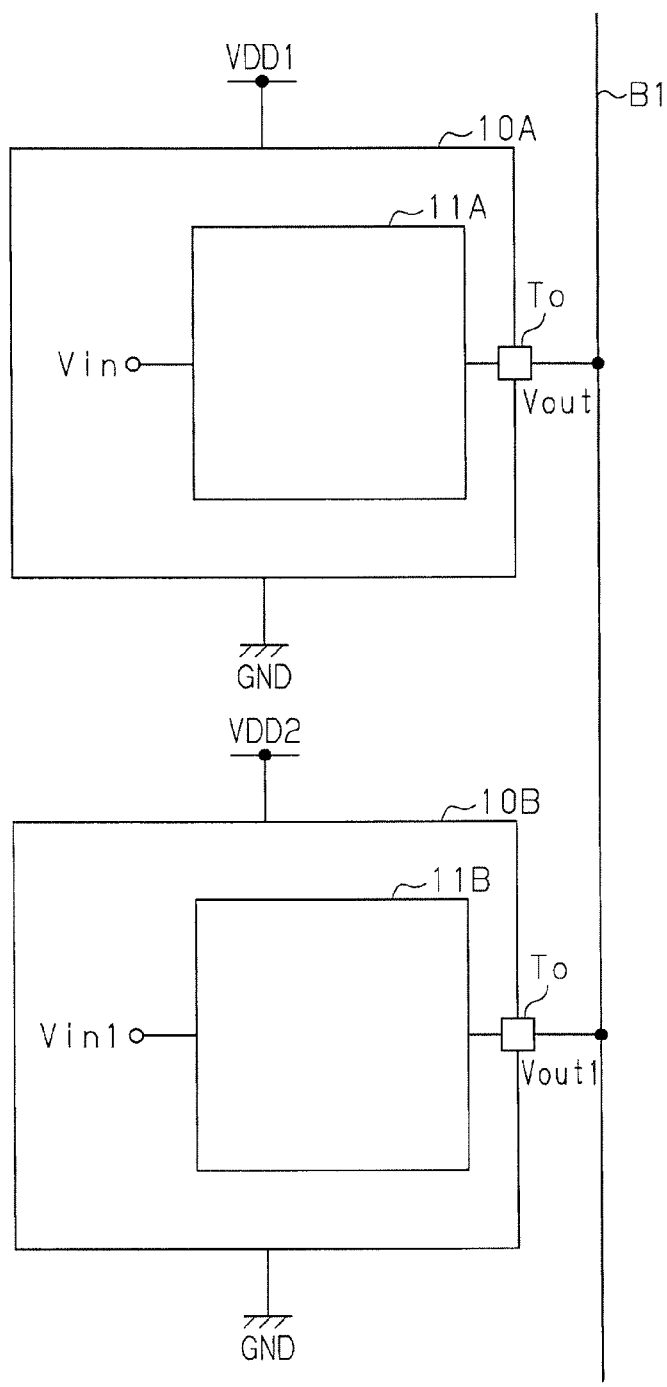
FIG. 3 is a schematic diagram of a semiconductor integrated circuit device.

As illustrated in FIG. 3, a semiconductor integrated circuit device includes a plurality of semiconductor devices 10A and 10B, which are coupled to a bus B1.

The semiconductor device 10A operates on a first high-potential power supply voltage VDD1 and a low-potential power supply voltage (e.g., ground GND). The semiconductor device 10A includes an output circuit 11A. The output circuit 11A outputs an output signal Vout in accordance with an input signal Vin, which is provided from an internal circuit (not illustrated) of the semiconductor device 10A, to the bus B1 via an output terminal To. The first high-potential power supply voltage VDD1 is, for example, 5 V. The low-potential power supply voltage GND is, for example, 0 V.

The semiconductor device 10B operates on a second high-potential power supply voltage VDD2 and the low-potential power supply voltage GND. The semiconductor device 10B includes an output circuit 11B. The output circuit 11B outputs an output signal Vout1 in accordance with an input signal Vin1, which is provided from an internal circuit of the semiconductor device 10B, to the bus B1 via the output terminal To. The second high-potential power supply voltage VDD2 is, for example, 3.3 V. The second high-potential power supply voltage VDD2 may be the same voltage as the first high-potential power supply voltage VDD1.

An example of the internal structure of the output circuit 11A will now be described. The output circuit 11B has the same structure as the output circuit 11A and will not be described.

Figure 1:
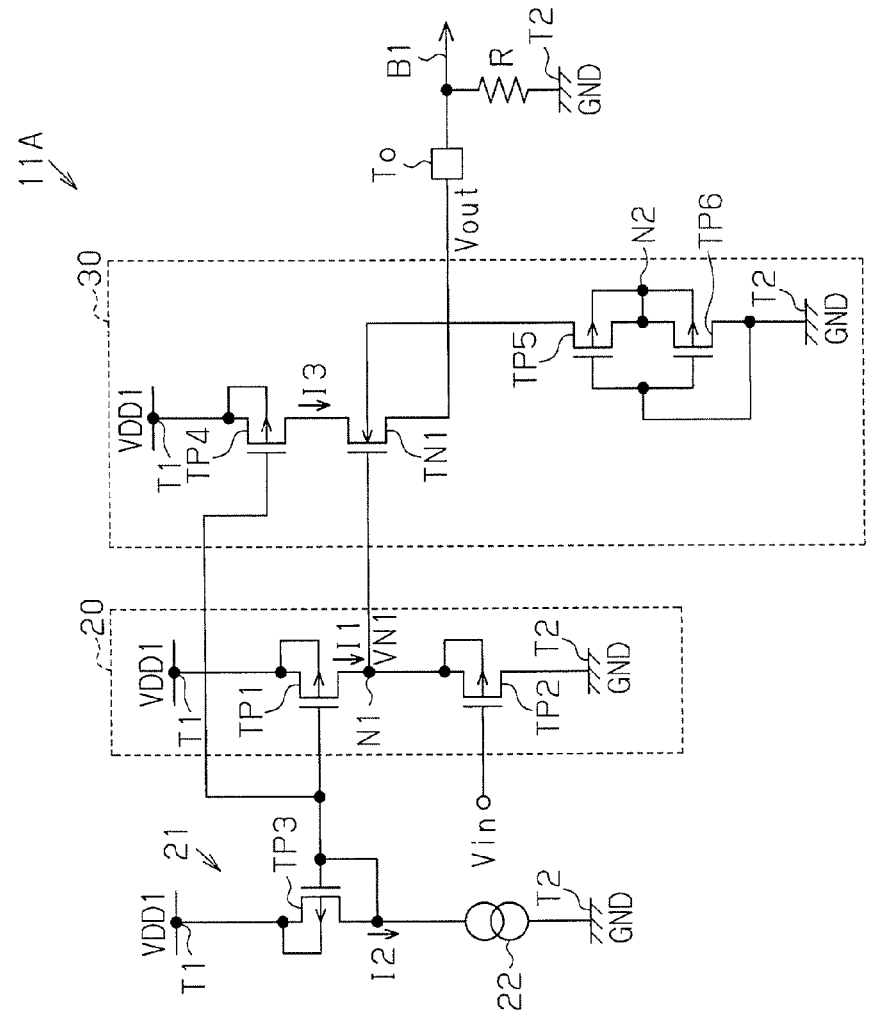
FIG. 1 is a circuit diagram of an output circuit according to a first embodiment.

As illustrated in FIG. 1, the output circuit 11A includes a buffer circuit 20 and an output stage 30. The buffer circuit 20 receives, from an internal circuit (not illustrated), an input signal Vin having a level in accordance with the operating voltage of the internal circuit. The output stage 30 outputs an output signal Vout, which is determined in accordance with the input signal Vin, to the output terminal To. In the present embodiment, the operating voltage of the internal circuit is set to be the same as the first high-potential power supply voltage VDD1. Alternatively, the operating voltage of the internal circuit may be set to be lower than the first high-potential power supply voltage VDD1. In this case, a voltage lower than the first high-potential power supply voltage VDD1 may be generated by, for example, lowering the first high-potential power supply voltage VDD1 with, for example, a step-down voltage regulator.

The buffer circuit 20 includes P-channel MOS transistors TP1 and TP2, which are coupled in series between a high-potential side power supply terminal T1 and a low-potential side power supply terminal T2. The high-potential side power supply terminal T1 is provided with the first high-potential power supply voltage VDD1. The low-potential side power supply terminal T2 is provided with the low-potential power supply voltage GND.

The transistor TP1 has a source coupled to the power supply terminal T1. The transistor TP1 has a drain coupled to the source of the transistor TP2, and a backgate coupled to the source of the transistor TP1. The transistor TP1 has a gate coupled to an output terminal of a current control circuit 21.

The current control circuit 21 controls a constant current I1 that flows from the transistor TP1. The current control circuit 21 includes a constant current source 22a and a P-channel MOS transistor TP3, which is coupled to the transistor TP1 to form a current mirror circuit. The constant current source 22 supplies a constant current I2. The constant current source 22 has a first terminal coupled to the power supply terminal T2. The constant current source 22 has a second terminal coupled to the drain of the transistor TP3. The is transistor TP3 has a source coupled to the power supply terminal T1 and a gate coupled to the drain of the transistor TP3 and the gate of the transistor TP1. The transistors TP1 and TP3 form the current mirror circuit. The current mirror circuit supplies the constant current I1, which is proportional to the constant current I2 flowing through the transistor TP3, in accordance with the electrical properties of the transistors TP1 and TP3. In this manner, the transistor TP1 and the current control circuit 21 function as constant current sources for supplying the constant current I1.

The transistor TP2 has a drain coupled to the power supply terminal T2. The transistor TP2 has a gate provided with the input signal Vin. The transistor TP2 has a backgate and a source coupled to each other. A node N1 between the transistors TP1 and TP2, that is, the source of the transistor TP2, is coupled to the output stage 30.

In this manner, the buffer circuit 20 is a source-follower circuit that includes the current source, which is provided with the transistor TP1, and the transistor TP2.

The output stage 30 includes a P-channel MOS transistor TP4 and an N-channel MOS transistor TN1, which are coupled in series between the power supply terminal T1 and the output terminal To, and P-channel MOS transistors TP5 and TP6, which are coupled to the backgate of the transistor TN1.

The transistor TP4 is coupled to the transistor TP3 to form a current mirror circuit. In detail, the transistor TP4 has a source coupled to the power supply terminal T1, and a gate coupled to the gate and the drain of the transistor TP3. Thus, the transistors TP3 and TP4 form the current mirror circuit. This current mirror circuit feeds a constant current I3, which is proportional to the constant current I2 flowing through the transistor TP3, in accordance with the electrical properties of the transistors TP3 and TP4. In this manner, the transistor TP4 and the current control circuit 21 function as constant current sources for supplying the constant current I3. For example, the current control circuit 21 also functions as a circuit that controls the constant current I3 flowing from the transistor TP4. The constant currents I1 and I2 are proportional to each other. Accordingly, the constant currents I1 and I3 are proportional to each other.

The transistor TP4 has a drain coupled to the drain of the transistor TN1, and a backgate coupled to the source of the transistor TP4.

The transistor TN1 has a gate coupled to the source (node N1) of the transistor TP2, and provided with a voltage VN1. The transistor TN1 has a source coupled to the output terminal To. In the illustrated example, the output terminal To is coupled to the power supply terminal T2 via a resistor R.

In this manner, the output stage 30 is a source-follower circuit that includes the current source, which is provided with the transistor TP4, and the transistor TN1.

The two P-channel MOS transistors TP5 and TP6 are coupled in series between the backgate of the transistor TN1 and the power supply terminal T2. In detail, the transistor TP5 has a drain coupled to the backgate of the transistor TN1 and a source coupled to the source of the transistor TP6. The transistor TP6 has a drain coupled to the power supply terminal T2. The transistors TP5 and TP6 have gates coupled to the power supply terminal T2. The transistor TP5 has a source coupled to the backgates (node N2) of the transistors TP5 and TP6. The backgates (node N2) of the transistors TP5 and TP6 are in a floating condition.

The N-channel MOS transistor TN1 described above is a MOS transistor of a conductivity type that differs from that of the P-channel MOS transistor TP2. In the illustrated example, the gate-source voltage Vgs1 of the transistor TN1 and the gate-source voltage Vgs2 of the transistor TP2 are set to be substantially the same.

When an input signal Vin is provided from the internal circuit of the output circuit 11A to the gate of the transistor TP2, the voltage VN1 at the node N1 between the transistors TP1 and TP2 is a value obtained by adding the gate-source voltage Vgs2 of the transistor TP2 to the input signal Vin. Thus, the voltage VN1 is expressed as $VN1 = Vin + Vgs2.$ The voltage VN1 at the node N1 is the gate voltage of the transistor TN1. Thus, the output signal Vout output from the source of the transistor TN1 is a value obtained by subtracting the gate-source voltage Vgs1 of the transistor TN1 from the voltage VN1. Thus, the output signal Vout is expressed as $$Vout = VN1 - Vgs1$$
$$= Vin + Vgs2 - Vgs1.$$

In the present embodiment, as described above, the gate-source voltages Vgs1 and Vgs2 of the transistors TN1 and TP2 are set to be substantially the same. Thus, the output signal Vout is substantially the same as the input signal Vin as the equation of $$Vout = Vin + Vgs2 - Vgs1 \approx Vin + Vgs1 - Vgs1 \approx Vin.$$

For example, the gate-source voltage Vgs1 of the transistor TN1 is determined by the drain voltage and the drain current of the transistor TN1. In other words, the gate-source voltage Vgs1 of the transistor TN1 is determined by the drain voltage of the transistor TP4 and the drain current (constant current I3) of the transistor TP4. The gate-source voltage Vgs2 of the transistor TP2 is determined by the drain voltage of the transistor TP1 and the drain current (constant current I1) of the transistor TP1. In the present embodiment, the transistors TN1 and TP2 have the same element size as the transistors TP1 and TP4 so that the transistors TN1 and TP2 have substantially the same gate-source voltages Vgs1 and Vgs2.

The cross-sectional structure of the output stage 30 will now be described. First, the cross-sectional structures of the P-channel MOS transistor TP4 and the N-channel MOS transistor TN1 will be described.

Figure 2:
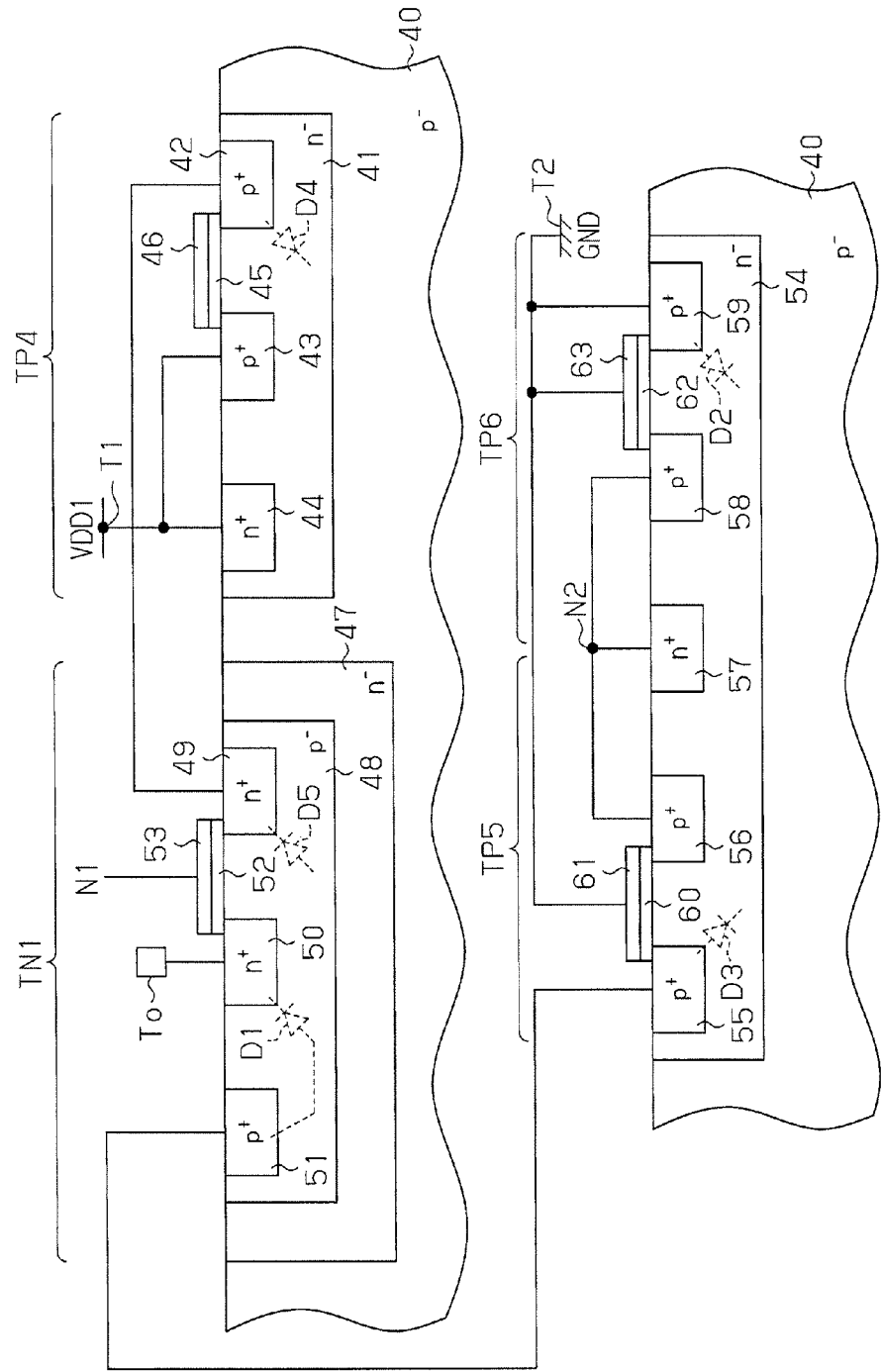
FIG. 2 is a schematic cross-section of the output circuit of the first embodiment.

As illustrated in FIG. 2, an n⁻ type well region 41 is formed on the surface of a p type semiconductor substrate 40. A p⁺ type drain region 42, a p⁺ type source region 43, and an n⁺ type backgate region 44 are formed on the surface of the n⁻ type well region 41. A gate oxidation film 45 and a gate electrode 46 are formed on the surface of the n⁻ type well region 41 between the p⁺ type source region 42 and the p⁺ type drain region 43. The p⁺ type drain region 42, the p⁺ type source region 43, the gate electrode 46, and the n⁺ type backgate region 44 respectively function as the drain, source, gate, and backgate of the P-channel MOS transistor TP4.

An n⁻ type well region 47 is formed on the surface of the p⁻ type semiconductor substrate 40. A p type well region 48 is formed on the surface of the n⁻ type well region 47. An n⁺ type drain region 49, an n⁺ source region 50, and a p⁺ type backgate region 51 are formed on the surface of the p⁻ type well region 48. A gate oxidation film 52 and a gate electrode 53 are formed on the surface of the p⁻ type well region 48 between the n⁺ type drain region 49 and the n⁺ type source region 50. The n⁺ type drain region 49, the n⁺ type source region 50, the gate electrode 53, and the p⁺ type backgate region 51 respectively function as the drain, source, gate, and backgate of the N-channel MOS transistor TN1.

Further, the p⁺ type drain region 42 is coupled to the n⁺ type drain region 49. The p⁺ type source region 43 and the n⁺ type backgate region 44 are coupled to the power supply terminal T1. The n⁺ type source region 50 is coupled to the output terminal To, and the p⁺ type backgate region 51 is coupled to the P-channel MOS transistor TP5.

The cross-sectional structures of the P-channel MOS transistors TP5 and TP6, which are coupled to the backgate of the N-channel MOS transistor TN1, will now be described.

An n⁻ type well region 54 is formed on the surface of the p⁻ type semiconductor substrate 40. A p⁺ type drain region 55, a p⁺ type source region 56, an n⁺ type backgate region 57, a p⁺ type source region 58, and a p⁺ type drain region 59 are formed on the surface of the n" type well region 54. A gate to oxidation film 60 and a gate electrode 61 are formed on the surface of the n⁻ type well region 54 between the p⁺ type drain region 55 and the p⁺ type source region 56. A gate oxidation film 62 and a gate electrode 63 are formed on the surface of the n⁻ type well region 54 between the p⁺ type source region 58 and the p⁺ type drain region 59. The p⁺ type drain region 55, the p⁺ type source region 56, the gate electrode 61, and the n⁺ type backgate region 57 respectively function as the drain, source, gate, and backgate of the P-channel MOS transistor TP5. The p⁺ type source region 58, the p⁺ type drain region 59, the gate electrode 63, and the n⁺ type backgate region 57 respectively function as the source, drain, gate, and backgate of the P-channel MOS transistor TP6. The p⁺ type drain region 55 is coupled to the p⁺ type backgate region 51. The gate electrodes 61 and 63 and the p⁺ type drain region 59 are coupled to the power supply terminal T2. The p⁺ type source region 56, the n⁺ type backgate region 57, and the p⁺ type source region 58 are coupled to the node N2.

The operation of the output circuit 11A will now be described.

The output circuit 11A performs this operation when the power supply terminal T2 of the semiconductor device 10A is disconnected from the low-potential side power supply line.

Figure 4:
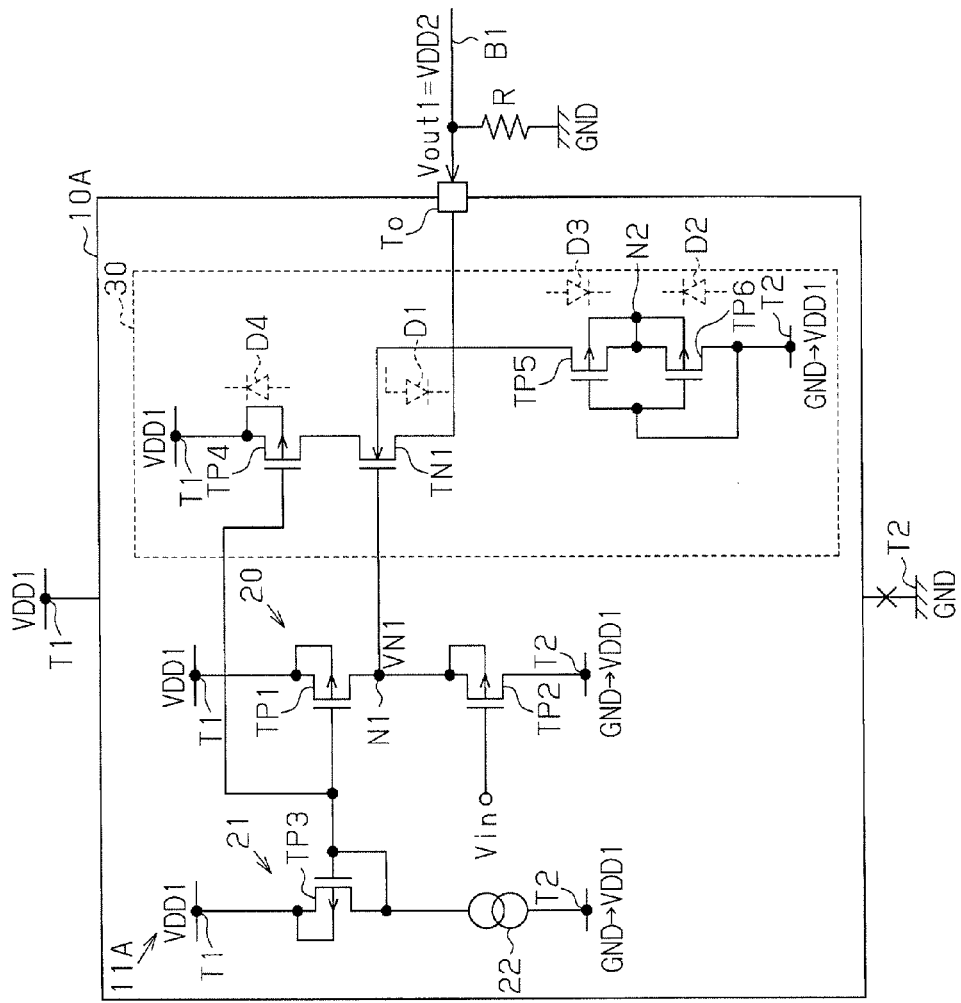
FIG. 4 is a circuit diagram illustrating the operation of the output circuit of the first embodiment.

As illustrated in FIG. 4, when the power supply terminal T2 of the semiconductor device 10A is unintentionally disconnected from the low-potential side power supply line, the DC current in the semiconductor device 10A raises the potential level of the power supply terminal T2 of the output circuit 11A from the low-potential power supply voltage GND to the first high-potential power supply voltage VDD1. In this case, if the output signal Vout1 having the second high-potential power supply voltage VDD2 is output from the other semiconductor device 10B (refer to FIG. 3) to the bus B1, the second high-potential power supply voltage VDD2 is applied to the output terminal To of the output circuit 11A. For example, the voltage (second high-potential power supply voltage VDD2 in this example) lower than the potential at the power supply terminal T2 of the output circuit 11A (first high-potential power supply voltage VDD1 in this example) is applied to the output terminal To. This raises the source voltage of the transistor TN1 to the level of the second high-potential power supply voltage VDD2. As illustrated in FIG. 2, a parasitic diode D1 is formed by a PN junction between the n+ type source region 50 and the p− type well region 48 (p+ type backgate region 51) of the transistor TN1. The parasitic diode D1 has a forward direction from the p+ type backgate region 51 to the n+ type source region 50. Thus, the backgate voltage of the transistor TN1 is higher than the second high-potential power supply voltage VDD2 by an amount corresponding to a forward voltage Vf of the parasitic diode D1.

As illustrated in FIG. 4, the gates of the transistors TP5 and TP6 and the drain of the transistor TP6 are provided with the first high-potential power supply voltage VDD1. The sources of the transistors TP5 and TP6, together with the backgates of the transistors TP5 and TP6, are coupled to the node N2, which is in a floating condition. As illustrated in FIG. 2, a parasitic diode D2 is formed by a PN junction between the p+ type drain region 59 and the n− type well region 54 of the transistor TP6 (n+ type backgate region 57 functioning as the backgates of the transistors TP5 and TP6). The parasitic diode D2 has a forward direction from the p+ type drain region 59 to the n− type well region 54 (n+ type backgate region 57). Thus, the voltage at the node N2, that is, the source voltage of the transistors TP5 and TP6, is lower than the first high-potential power supply voltage VDD1 by an amount corresponding to a forward voltage Vf of the parasitic diode D2. In this case, the transistors TP5 and TP6 are turned off. The parasitic diode D2 and a parasitic diode D3, which is formed between the p+ type drain region 55 and the n− type well region 54, are produced between the p+ type drain region 55, which is coupled to the backgate of the transistor TN1, and the power supply terminal T2. The parasitic diode D3 has a forward direction from the p+ type drain region 55 to the n− type well region 54 (n+ type backgate region 57). Thus, as illustrated in FIG. 4, even when the voltage (second high-potential power supply voltage VDD2 in this example) that is lower than the potential at the power supply terminal T2 (first high-potential power supply voltage VDD1 in this example) is applied to the output terminal To, this structure prevents current from flowing from the power supply terminal T2 to the bus B1 due to the parasitic to diode D3. Thus, a defect in the semiconductor device 10A would not cause an erroneous operation of the other semiconductor device 10B.

In the illustrated example, the gate voltage of the transistor TP4 reaches the level of the first high-potential power supply voltage VDD1, which is the same as the source voltage of the transistor TP4. This turns off the transistor TP4. As illustrated in FIG. 2, a parasitic diode D4, which has a forward direction from the p+ type drain region 42 to the n− type well region 41, is formed between the p+ type drain region 42 and the n− type well region 41 of the transistor TP4. Thus, as illustrated in FIG. 4, even when the second high-potential power supply voltage VDD2 is applied to the source of the transistor TN1 to turn on the transistor TN1, this structure prevents current from flowing from the output terminal To to the power supply terminal T1 due to the parasitic diode D4.

The output circuit 11A performs the operation described below when the power supply terminal T1 is disconnected from the high-potential side power supply line of the semiconductor device 10A.

Figure 5:
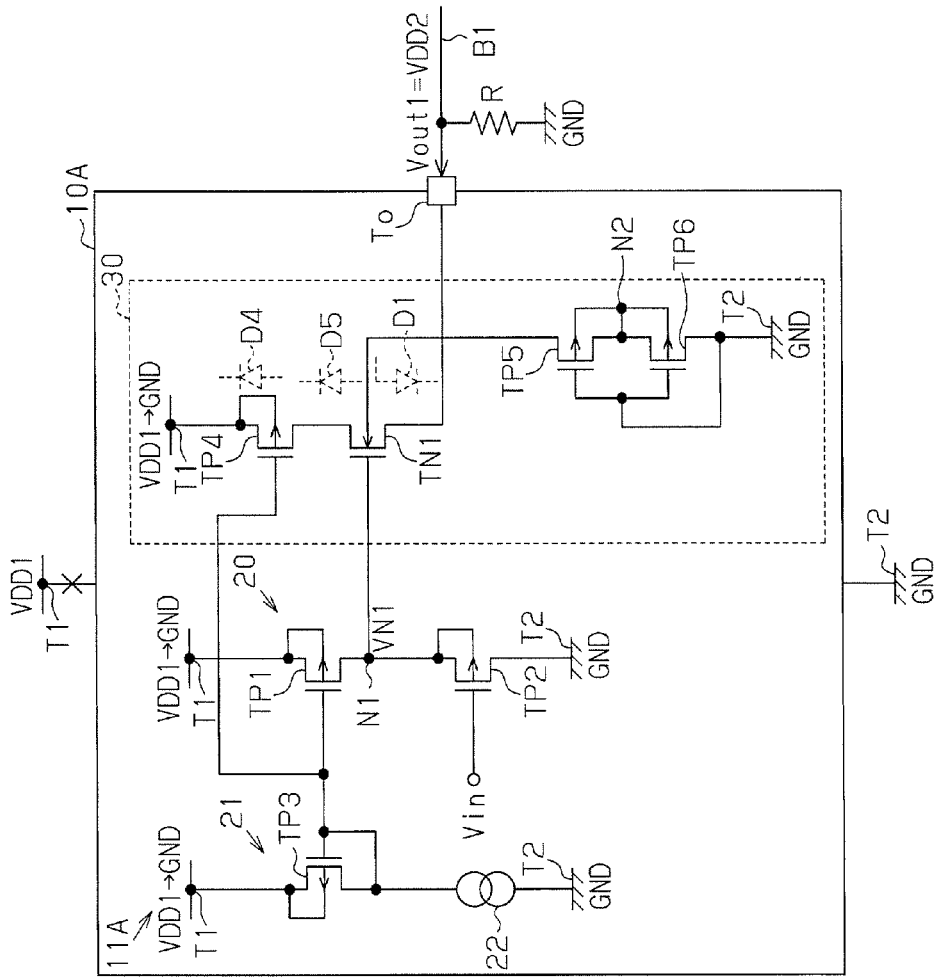
FIG. 5 is a circuit diagram illustrating the operation of the output circuit of the first embodiment.

As illustrated in FIG. 5, when the power supply terminal T1 of the semiconductor device 10A is unintentionally disconnected from the high-potential side power supply line, the potential level of the power supply terminal T1 of the output circuit 11A decreases from the first high-potential power supply voltage VDD1 to the low-potential power supply voltage GND. In this case, when an output signal Vout1 having the second high-potential power supply voltage VDD2 is being output from the other semiconductor device 10B (refer to FIG. 3) to the bus B1, the second high-potential power supply voltage VDD2 is applied to the output terminal To of the output circuit 11A. For example, the voltage (second high-potential power supply voltage VDD2 in this example) that is higher than the potential at the power supply terminal T1 of the output circuit 11A (low-potential power supply voltage GND in this example) is output to the output terminal To. This raises the source voltage of the transistor TN1 to the level of the second high-potential power supply voltage VDD2. The gate voltage of the transistor TN1 reaches the low-potential power supply voltage GND. This turns off the transistor TN1. In this state, the parasitic diode D1 having a forward direction from the backgate to the source of the transistor TN1 is formed between the source and the backgate of the transistor TN1. Thus, as illustrated in FIG. 5, even when the voltage (second high-potential power supply voltage VDD2 in this example) that is higher than the potential level of the power supply terminal T1 (low-potential power supply voltage GND in this example) is applied to the output terminal To, this structure prevents current from flowing from the output terminal To to the power supply terminal T1 due to the parasitic diode D1.

In detail, if the backgate of the transistor TNi is coupled to its source, current flows from the output terminal To to the power supply terminal T1 through parasitic diodes D5 and D4 formed in the transistors TN1 and TP4. For example, referring to FIG. 2, when, for example, the source of the transistor TN1 is coupled to its backgate, the p+ type backgate region 51 of the transistor TN1 is coupled to the output terminal To. Thus, current flows from the output terminal To of the p− type well region 48 through the p+ type backgate region 51, and current flows through the p+ type drain region 42 of the transistor TP4 through the parasitic diode D5 having a forward direction from the p− type well region 48 to the n+ type drain region 49. Further, current flows through the power supply terminal T1 via the parasitic diode D4 having a forward direction from the p+ type drain region 42 to the n− type well region 41. In contrast, as illustrated in FIG. 2, in the output circuit 11A of the present embodiment, the backgate of the transistor TN1 is disconnected from the source of the transistor TN1. This prevents current from flowing from the output terminal To to the p− type well region 48 through the p+ type backgate region 51. Further, as described above, the parasitic diode D1 having a forward direction from the p− type well region 48 to the n+ type source region 50 is formed between the n+ type source region 50, which is coupled to the output terminal To, and the p− type well region 48. Thus, even when the voltage higher than the potential at the power supply terminal T1 is applied to the output terminal To, this structure prevents current from flowing from the output terminal To to the p− type well region 48 through the n+ type source region 50. This prevents current from flowing from the output terminal To to the power supply terminal T1.

The above embodiment has the advantages described below.

(1) The two P-channel MOS transistors TP5 and TP6 are coupled in series between the backgate of the N-channel MOS transistor TN1, which is the output transistor of the output stage 30, and the power supply terminal T2. The sources of the transistors TP5 and TP6 and the backgates of the transistors TP5 and TP6 are coupled to the node N2, which is in a floating condition. This prevents current from flowing from the power supply terminal T2 to the bus B1 due to the parasitic diode D3 formed in the P-channel MOS transistor TP5 even when the voltage lower than the potential at the power supply terminal T2 is applied to the output terminal To. Thus, a defect in one semiconductor device 10A would not cause an erroneous operation of the other semiconductor device 10B.

(2) The backgate of the transistor TN1 is coupled to the power supply terminal T2 via the transistors TP5 and TP6. This prevents current from flowing from the output terminal To to the power supply terminal T1 due to the parasitic diode D1 formed between the source and the backgate of the transistor TN1 even when a voltage that is higher than the potential at the power supply terminal T1 is applied to the output terminal To.

(3) The buffer circuit 20, which is a source-follower circuit including the P-channel MOS transistor TP1 functioning as a current source and the P-channel MOS transistor TP2 coupled to the transistor TP1, is arranged in a preceding stage of the output stage 30. The element sizes and the like of the transistors TN1 and TP2 are set in a manner that the gate-source voltage Vgs1 of the transistor TN1 and the gate-source voltage Vgs2 of the transistor TP2 will be the same. This allows the output terminal To of the output circuit 11A to output the output signal Vout having substantially the same level as the input signal Vin.

A second embodiment will now be described with reference to FIGS. 6 to 8. Same reference numerals are given to those components that are the same as the components illustrated in FIGS. 1 to 5. Such components will not be described in detail.

Like the semiconductor integrated circuit device of the first embodiment illustrated in FIG. 3, a semiconductor integrated circuit device according to the present embodiment includes a plurality of semiconductor devices 10A and 10B, which are coupled to a bus B1. The semiconductor devices 10A and 10B may be, for example, electronic control units (ECUs) mounted on automobiles. The semiconductor devices 10A and 10B (ECUs) control an engine, a transmission, power windows, lamps, door mirrors, and other components. The semiconductor devices 10A and 10B communicate with each other through the bus B1. In the illustrated example, the first high-potential power supply voltage VDD1 and the second high-potential power supply voltage VDD2 are battery voltages (e.g., 12 V), and the low-potential power supply voltage GND is, for example, 0 V.

The internal structure of an output circuit 11A arranged in the semiconductor device 10A will now described.

Figure 6:
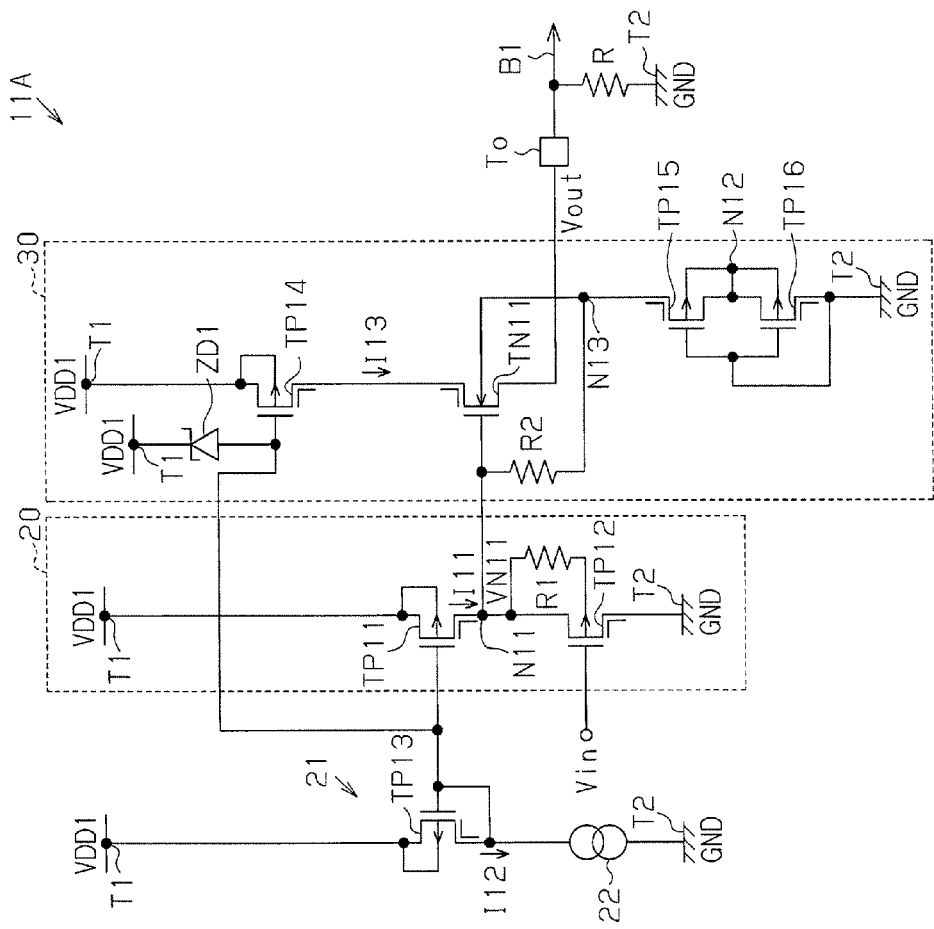
FIG. 6 is a circuit diagram of an output circuit according to a second embodiment.

As illustrated in FIG. 6, a buffer circuit 20 arranged in the output circuit 11A includes P-channel laterally diffused metal oxide semiconductor (LDMOS) transistors TP11 and TP12, such as laterally double-diffused insulated gate MOS transistors. The LDMOS transistors TP11 and TP12 are coupled in series between a power supply terminal T1 and a power supply terminal T2. As known in the art, an LDMOS transistor is a MOS transistor having a drain with a high breakdown voltage by providing a larger distance between its gate and drain than between its gate (channel region) and source. In the drawing, the double lined part of each LDMOS transistor corresponds to the drain of each LDMOS transistor.

The transistor TP11 has a source coupled to the power supply terminal T1. The transistor TP11 has a drain coupled to the source of the transistor TP12, and a backgate coupled to the source of the transistor TP11. The transistor TP11 has a gate coupled to an output terminal of the current control circuit 21.

The current control circuit 21 controls a constant current I11 flow from the transistor TP11. The current control circuit 21 includes a constant current source 22 and a P-channel LDMOS transistor TP13. The LDMOS transistor TP13 is coupled to the transistor TP11 to form a current mirror circuit. The constant current source 22 supplies a constant current I12. The constant current source 22 has a first terminal coupled to the power supply terminal T2. The constant current source 22 has a second terminal coupled to the drain of the transistor TP13. The transistor TP13 has a source coupled to the power supply terminal T1, and a gate coupled to the drain of the transistor TP13 and the gate of the transistor TP11. Thus, the transistors TP11 and TP13 form the current mirror circuit. The current mirror circuit supplies the constant current I11, which is proportional to the constant current I12 flowing through the transistor TP13, in accordance with the electrical properties of the transistors TP11 and TP13. In this manner, the transistor TP11 and the current control circuit 21 function as constant current sources for supplying the constant current I11.

The transistor TP12 has a drain coupled to the power supply terminal T2. The transistor TP12 has a gate provided with an input signal Vin. The transistor TP12 has a backgate coupled to the source of the transistor TP12 via a resistor R1 functioning as a third resistor. A node N11 between the transistors TP11 and TP12, that is, the source of the transistor TP12, is coupled to the output stage 30.

In this manner, the buffer circuit 20 is a source-follower circuit that includes the current source, which is provided with the transistor TP11, and the transistor TP12.

The output stage 30 includes a P-channel LDMOS transistor TP14 and an N-channel LDMOS transistor TN11, which are coupled in series between the power supply terminal T1 and the output terminal To, P-channel LDMOS transistors TP15 and TP16, which are coupled to the backgate of the transistor TN11, and a resistor R2 functioning as a first resistor.

The transistor TP14 is coupled to the transistor TP13 to form a current mirror circuit. In detail, the transistor TP14 has a source coupled to the power supply terminal T1, and a gate coupled to the gate and the drain of the transistor TP13. Thus, the transistors TP13 and TP14 form the current mirror circuit. This current mirror circuit supplies a constant current I13, which is proportional to the constant current I12 flowing to the transistor TP13, in accordance with the electrical properties of the transistors TP13 and TP14. In this manner, the transistor TP14 and the current control circuit 21 function as constant current sources for supplying the constant current I13. For example, the current control circuit 21 also functions as a circuit that controls the constant current I13 flowing from the transistor TP14.

The transistor TN14 has a drain coupled to the drain of the transistor TN11, and a backgate coupled to the source of the transistor TP14. The transistor TP14 has a gate coupled to an anode of a Zener diode ZD1. The Zener diode ZD1 has a cathode coupled to the power supply terminal T1. The Zener diode ZD1 prevents an overvoltage that is higher than the first high-potential power supply voltage VDD1 from being applied to the gate of the transistor TP14. For example, the Zener diode ZD1 prevents an overvoltage that is higher than the gate breakdown voltage of the transistor TP14 (e.g., 12 V) from being applied to the gate of the transistor TP14.

The transistor TN11 has a gate coupled to the source (node N11) of the transistor TP12 and provided with a voltage VN11. The transistor TN11 has a source coupled to the output terminal To. In the illustrated example, the output terminal To is coupled to the power supply terminal T2 via a resistor R.

In this manner, the output stage 30 is a source-follower circuit that the current source, which is provided with the transistor TP14, and the transistor TN11.

The two LDMOS transistors TP15 and TP16 are coupled in series between the backgate of the transistor TN11 and the power supply terminal T2. In detail, the transistor TP15 has a drain coupled to the backgate of the transistor TN11. The transistor TP15 has a source coupled to the source of the transistor TP16. The transistor TP16 has a drain coupled to the power supply terminal T2. The transistors TP15 and TP16 have gates coupled to the power supply terminal T2. The transistor TP15 has a source coupled to the backgates (node N12) of the transistors TP15 and TP16. The backgates (node N12) of the transistors TP15 and TP16 are in a floating condition.

The transistor TN11 has a backgate (node N13) coupled to the gate of the transistor TN11 via the resistor R2.

The N-channel LDMOS transistor TN11 is a MOS transistor of a conductivity type that differs from that of the P-channel LDMOS transistor TP12. In the illustrated example, the element sizes of the transistors TN11 and TP12 and the transistors TP11 and TP14 are set so that the gate-source voltage Vgs11 of the transistor TN11 is substantially the same as the gate-source voltage Vgs12 of the transistor TP12.

The cross-sectional structure of the output stage 30 will now be described. First, the cross-sectional structures of the P-channel LDMOS transistor TP14 and the N-channel LDMOS transistor TN11 will be described.

Figure 7:
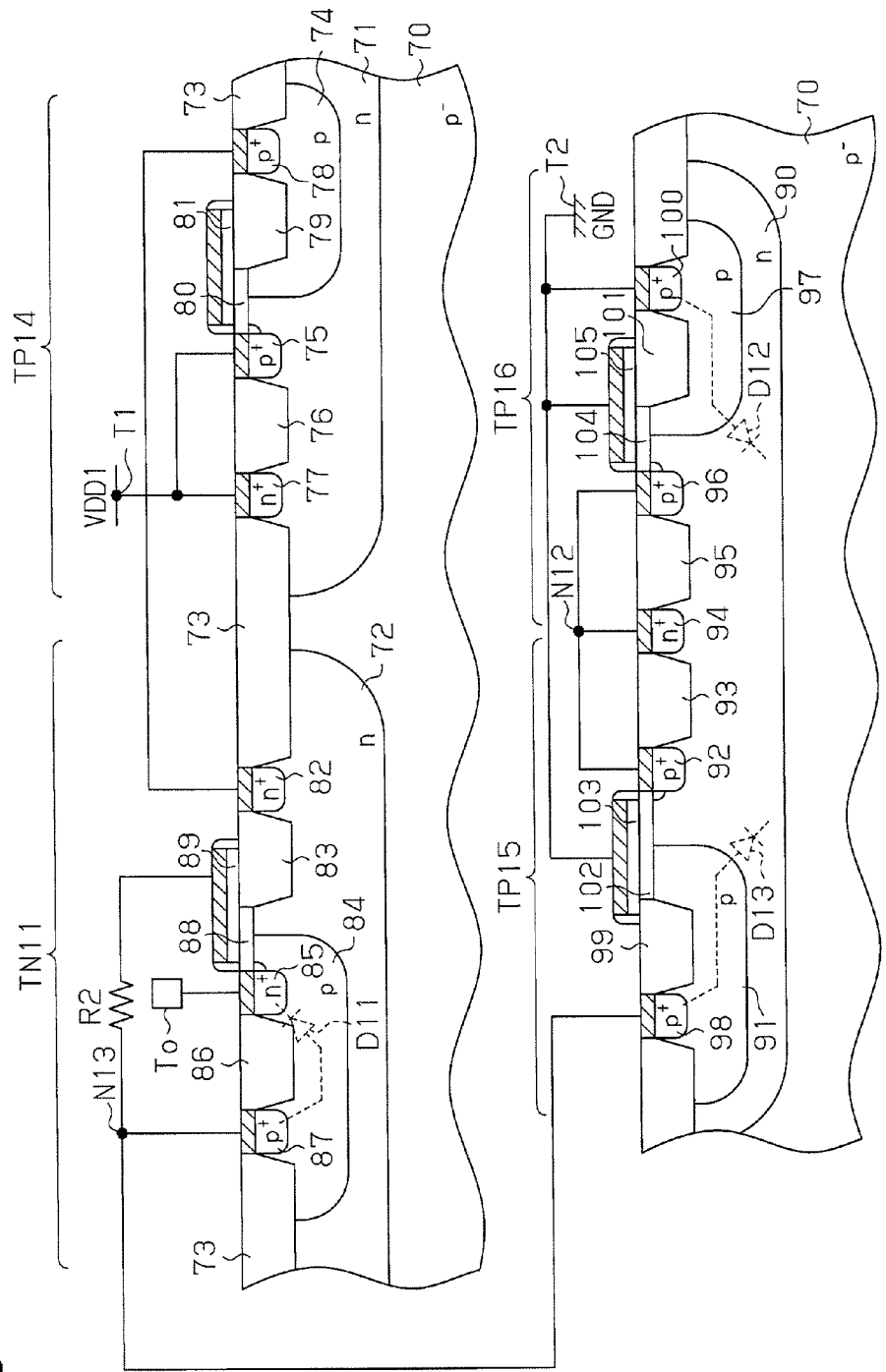
FIG. 7 is a schematic cross-section of the output circuit of the second embodiment.

As illustrated in FIG. 7, an n type body region (n type well region) 71, an n type drift region (n type well region) 72, and an element isolation film 73 are formed on the surface of the p⁻ type semiconductor substrate 70. The element isolation film 73 is formed by a method known in the art, such as shallow trench isolation (STI) or local oxidation of silicon (LOCOS).

The P-channel LDMOS transistor TP14 is formed in the n type body region 71. In detail, a p type drift region 74, a p⁺ type source region 75, a field oxidation film 76, and an n⁺ type backgate region 77 are formed on the surface of the n type body region 71. A p⁺ type drain region 78 and a field oxidation film 79 are formed on the surface of the p type drift region 74. The field oxidation film 76 is formed between the p⁺ type source region 75 and the n⁺ type backgate region 77. The field oxidation film 79 is formed between the p⁺ type drain region 78 and the p⁺ type source region 75, and is separated from the n type body region 71. The field oxidation films 76 and 79 are formed by a method known in the art, such as STI or LOCOS. It is preferable that a silicide layer is formed in each of the p⁺ type source region 75, the p⁺ type drain region 78, and the n⁺ type backgate region 77. The silicide layer may be formed by, for example, causing a metal material having a high melting point (e.g., cobalt) to react with silicon.

A gate oxidation film 80 is formed on the surfaces of the n type body region 71 and the p type drift region 74 between the p⁺ type source region 75 and the field oxidation film 79. A gate electrode 81 is formed to extend from above the gate oxidation film 80 to above the field oxidation film 79. A silicide layer is formed on the gate electrode 81. Sidewalls are formed on the sides of the gate electrode 81.

An n⁺ type drain region 82, a field oxidation film 83, and a p type body region 84 (p type well region) are formed on the surface of the n type drift is region 72. An n⁺ type source region 85, a field oxidation film 86, and a p⁺ type backgate region 87 are formed on the surface of the p type body region 84. The field oxidation film 83 is formed between the n⁺ type drain region 82 and the n⁺ type source region 85, and is separated from the p type body region 84. The field oxidation film 86 is formed between the n⁺ type source region 85 and the p⁺ type backgate region 87. The field oxidation films 83 and 86 are formed by a method known in the art, such as STI or LOCOS. It is preferable that a silicide layer is formed in each of the n⁺ type drain region 82, the n⁺ type source region 85, and the p⁺ type backgate region 87.

A gate oxidation film 88 is formed on the surface of the p type body region 84 and the n type drift region 72 between the n⁺ type source region 85 and the field oxidation film 83. A gate electrode 89 is formed to extend from above the gate oxidation film 88 to above the field oxidation film 83. A silicide layer is formed on the gate electrode 89. Sidewalls are formed on the sides of the gate electrode 89.

In the LDMOS transistors TP14 and TN11, the p⁺ type source region 75 and the n⁺ type backgate region 77 are coupled to the power supply terminal T1, and the p⁺ type drain region 78 is coupled to the n⁺ type drain region 82. The n⁺ type source region 85 is coupled to the output terminal To. The p⁺ type backgate region 87 is coupled to the gate electrode 89 via the resistor R2. The p⁺ type backgate region 87 is coupled to the P-channel LDMOS transistor TP15.

The cross-sectional structures of the P-channel LDMOS transistors TP15 and TP16, which are coupled to the backgate of the N-channel LDMOS transistor TN11, will now be described.

An n type body region 90 is formed on the surface of the p⁻ type semiconductor substrate 70. The P-channel LDMOS transistors TP15 and TP16 are formed in the n type body region 90. In further detail, a p type drift region 91, a p⁺ type source region 92, a field oxidation film 93, an n⁺ type backgate region 94, a field oxidation film 95, a p⁺ type source region 96, and a p type drift region 97 are formed on the surface of the n type body region 90. A p⁺ type drain region 98 and a field oxidation film 99 are formed in the p type drift region 91. The field oxidation film 99 is formed between the p⁺ type drain region 98 and the p⁺ type source region 92, and separated from the n type body region 90. A p⁺ type drain region 100 and a field oxidation film 101 are formed in the p type drift region 97. The field oxidation film 101 is formed between the p⁺ type drain region 100 and the p⁺ type source region 96, and separated from the n type body region 90. The field oxidation film 93 is formed between the p⁺ type source region 92 and the n⁺ type backgate region 94. The field oxidation film 95 is formed between the p⁺ type source region 96 and the n⁺ type backgate region 94. The field oxidation films 93, 95, 99, and 101 are formed by a method known in the art, such as STI or LOCOS. It is preferable that a silicide layer is formed in each of the p⁺ type drain regions 98 and 100, the p⁺ type source regions 92 and 96, and the n⁺ type backgate region 94.

A gate oxidation film 102 is formed on the surfaces of the p type drift region 91 and the n type body region 90 between the p⁺ type source region 92 and the field oxidation film 99. A gate electrode 103 is formed to extend from above the gate oxidation film 102 to above the field oxidation film 99. A silicide layer is formed on the gate electrode 103. Sidewalls are formed on the sides of the gate electrode 103.

Likewise, a gate oxidation film 104 is formed on the surfaces of the p type drift region 97 and the n type body region 90 between the p⁺ type source region 96 and the field oxidation film 101. A gate electrode 105 is formed to extend from above the gate oxidation film 104 to above the field oxidation film 101. A silicide layer is formed on the gate electrode 105. Sidewalls are formed on the sides of the gate electrode 105.

In the LDMOS transistors TP15 and TP16, the p+ type drain region 98 of the transistor TP15 is coupled to the p+ type backgate region 87 of the transistor TN11, and the gate electrodes 103 and 105 and the p+ type drain region 100 of the transistor TP16 are coupled to the power supply terminal T2. The n+ type backgate region 94 of the transistors TP15 and TP16, the p+ type source region 92 of the transistor TP15, and the p+ type source region 96 of the transistor TP16 are coupled to the common node N12.

The LDMOS transistors TN11, TP14, TP15, and TP16 described above include the field oxidation films 79, 83, 99, and 101 that provide a larger distance between the gate and the drain than between the gate and the source to ensure a high breakdown voltage at the drain. For example, the N-channel LDMOS transistor TN11 has a gate-source breakdown voltage of, for example, 12 V, and has a drain-source breakdown voltage of, for example, 42 V. The P-channel LDMOS transistors TP14, TP15, and TP16 each have a breakdown voltage of, for example, 42 V between the drain and the p type semiconductor substrate 70. Further, the P channel LDMOS transistors TP14, TP15, and TP16 each have a high breakdown voltage against a negative voltage between the drain and the p− type semiconductor substrate 70. For example, the P-channel LDMOS transistors TP14, TP15, and TP16 each have a breakdown voltage of, for example, −42 V against a negative voltage between the drain and the p− type semiconductor substrate 70. Each breakdown voltage is expressed as an absolute voltage when the potential at the p− type semiconductor substrate 70 is 0 V. The value of each breakdown voltage is a mere example, and may be adjusted in an appropriate manner.

The operation of the output circuit 11A will now be described. The output circuit 11A performs this operation when the power supply terminal T2 of the semiconductor device 10A is disconnected from the low-potential side power supply line.

Figure 8:
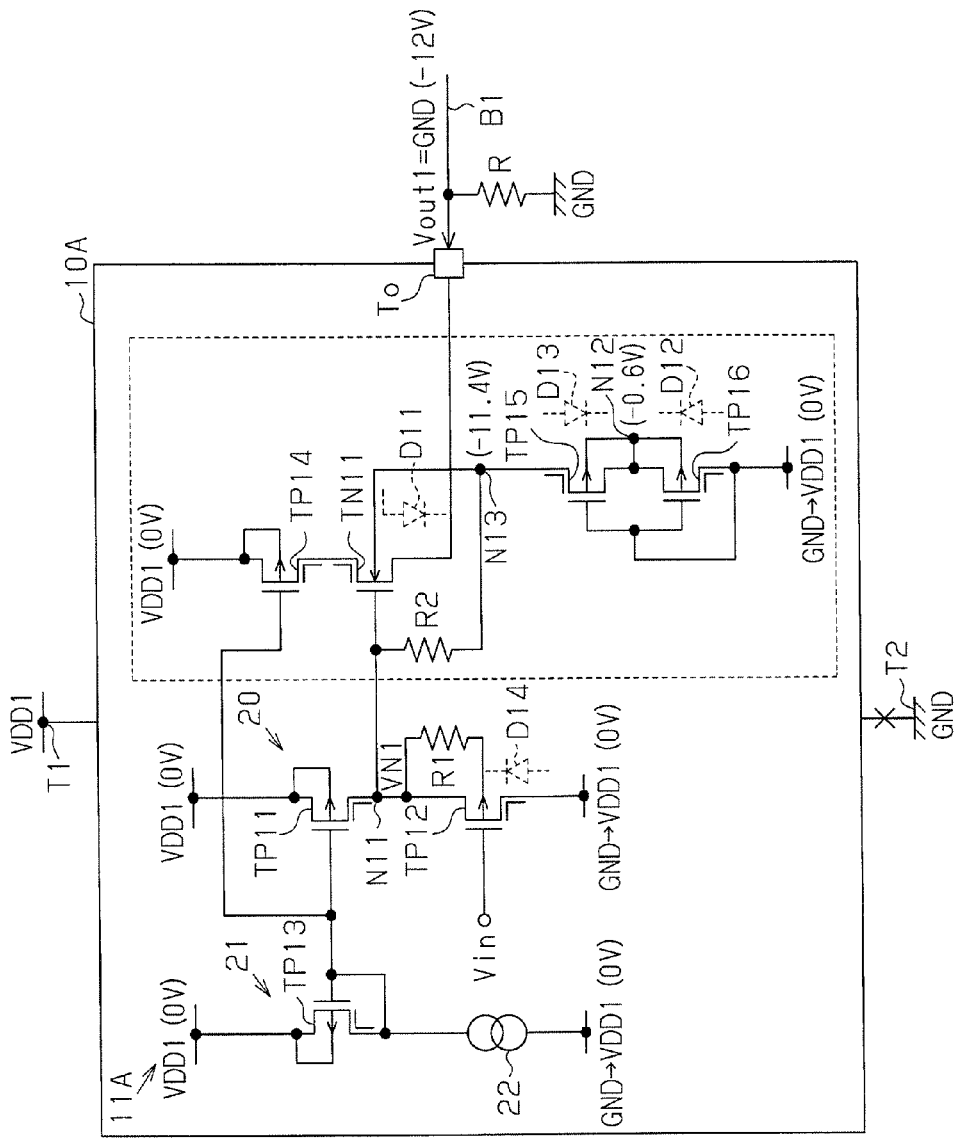
FIG. 8 is a circuit diagram illustrating the operation of the output circuit of the second embodiment.

As illustrated in FIG. 8, when the power supply terminal T2 of the semiconductor device 10A is unintentionally disconnected from the low-potential side power supply line, the DC current in the semiconductor device 10A raises the potential level of the power supply terminal T2 of the output circuit 11A from the low-potential power supply voltage GND to the first high-potential power supply voltage VDD1. When the output signal Vout1 having the low-potential power supply voltage GND is output to the bus B1 from the other semiconductor device 10B, the low-potential power supply voltage GND is applied to the output terminal To of the output circuit 11A. When the potential at the power supply terminal T2 of the output circuit 11A is 0 V, the voltage applied to the output terminal To is a negative voltage (−12 V in this example) relative to the power supply terminal T2. Likewise, FIG. 8 illustrates relative voltages in parentheses when the potential at the power supply terminal T2 of the semiconductor device 10A is 0 V (for example, the potential at the p− type semiconductor substrate 70 is 0 V). In detail, the source voltage of the transistor TN1 is −12 V. As illustrated in FIG. 7, a parasitic diode D11 is formed by a PN junction between the n+ type source region 85, which functions as the source of the transistor TN11, and the p type body region 84 (p+ type backgate region 87 of the transistor TN11). The parasitic diode D11 has a forward direction from the backgate region 87 to the n+ type source region 85. As illustrated in FIG. 8, the backgate voltage of the transistor TN11 is higher than the source voltage of the transistor TN11 by an amount corresponding to the forward voltage Vf of the parasitic diode D11 (0.6 V in this example), and is −11.4 V. Thus, the voltage of −11.4 V is applied to the drain of the transistor TP15. As described above, the breakdown voltage against a negative voltage between the drain of the P-channel LDMOS transistor TP15 and the p− type semiconductor substrate 70 is −42 V. Thus, the relatively high negative voltage of −11.4 V would not damage the transistor TP15.

As illustrated in FIG. 8, the gates of the transistors TP15 and TP16 and the drain of the transistor TP16 are provided with the first high-potential power supply voltage VDD1. For example, the gate voltages of the transistors TP15 and TP16 and the drain voltage of the transistor TP16 are 0 V. The sources of the transistors TP15 and TP16, together with the backgates of the transistors TP15 and TP16, are coupled to the node N12, which is in a floating condition. As illustrated in FIG. 7, a parasitic diode D12 is formed by a PN junction between the p+ type drain region 100 and the n type body region 90 (n+ type backgate region 94 functioning as the backgates of the transistors TP15 and TP16) of the transistor TP16. The parasitic diode D12 has a forward direction from the p+ type drain region 100 to the n type body region 90 (n+ type backgate region 94) through the p type drift region 97. Thus, as illustrated in FIG. 8, the voltage of the node N12, or the source voltage of each of the transistors TP15 and TP16 is a voltage lower than the drain voltage of the transistor TP16 (0 V in this example) by an amount corresponding to the forward voltage Vf (0.6 V in this example) of the parasitic diode D12, and is −0.6 V. This turns off the transistors TP15 and TP16. As illustrated in FIG. 7, the parasitic diode D12 and a parasitic diode D13, which is formed between the p+ type drain region 98 and the n type body region 90, are formed between the p+ type drain region 98, which is coupled to the backgate of the transistor TN11, and the power supply terminal T2. The parasitic diode D13 has a forward direction extending from the p+ type drain region 98 to the n type body region 90 through the p type drift region 91. As illustrated in FIG. 8, even when a voltage (−12 V in this example) lower than the potential at the power supply terminal T2 (0 V in this example) is applied to the output terminal To, this structure prevents current from flowing from the power supply terminal T2 to the bus B1 due to the parasitic diode D13. Thus, a defect in the semiconductor device 10A would not cause an erroneous operation of the other semiconductor device 10B. In other words, even when the power supply terminal T2 of the semiconductor device 10A is disconnected (when one semiconductor device 10A is broken), the other semiconductor device 10B may perform communication in a normal manner.

The output circuit 11A of the present embodiment includes the transistor TN11 having the backgate coupled to the gate of the transistor TN11 via the resistor R2. Thus, the gate voltage of the transistor TN11 is higher than the backgate voltage of the transistor TN11 by an amount corresponding to the voltage drop caused by the resistor R2. This lowers the gate-source voltage of the transistor TN11. Thus, when, for example, the voltage of the power supply terminal T1 and the voltage applied from the bus B1 to the output terminal To has a potential difference greater than the gate-source breakdown voltage (12 V in this example) of the transistor TN11, this structure prevents a voltage that is greater than or equal to the gate-source breakdown voltage from being applied between the gate and the source of the transistor TN11.

Also, when the gate voltage of the transistor TN11 becomes a negative voltage, the source voltage of the transistor TP12 also becomes a negative voltage. In this case, the gate voltage of the transistor TP12 becomes 0 V. This turns off the transistor TP12. A current path including the resistor R1 and a parasitic diode D14 formed between the backgate and the drain of the transistor TP12 is formed between the node N11 and the power supply terminal T2. However, this current path includes the resistor R1, of which the resistance may be controlled to reduce the amount of current flowing through the current path. For example, the output circuit 11A of the present embodiment sets the resistance of the resistor R1 to control the amount of current flowing through the current path to or below a value specified by standards such as the Controller Area Network (CAN) or the Local Interconnect Network (LIN).

As described above, the parasitic diode D11 having a forward direction from the backgate to the source of the transistor TN1 is formed between the source and the backgate of the transistor TN1. Thus, even when, for example, a voltage higher than the potential at the power supply terminal T1 is applied to the output terminal To, this structure prevents current from flowing from the output terminal To to the power supply terminal T1 due to the parasitic diode D11.

The above embodiment has the advantages described below in addition to advantages (1) to (3) of the first embodiment.

(4) The two P-channel LDMOS transistors TP15 and TP16 are coupled in series to the backgate of the N-channel LDMOS transistor TN11 so that their drains are located on the outer side. Thus, when the voltage (negative voltage) lower than the potential at the power supply terminal T2 is applied to the output terminal To, the negative voltage is applied to the drain of the P-channel LDMOS transistor TP15. The breakdown voltage (e.g., −42 V) against the negative voltage between the drain of the P-channel LDMOS transistor TP15 and the p⁻ type semiconductor substrate 70 is high. Thus, even when the potential difference is relatively high between the voltage of the power supply terminal T2 and the voltage (negative voltage) applied to the output terminal To, breakage caused by the negative voltage is suppressed in a preferable manner for the transistor TP15.

(5) The P-channel LDMOS transistors TP15 and TP16 may be substituted by bipolar transistors that have breakdown voltages against negative voltages. However, this would lead to the following problems. The formation of a bipolar transistor and a complementary metal oxide semiconductor (CMOS) on the same chip would result in the need for a BiCMOS process to be performed. This would increase the number of steps and the manufacturing cost. Further, such bipolar transistors that have high breakdown voltages against negative voltages need special substrates. This significantly increases the manufacturing cost. In this regard, the present embodiment uses LDMOS transistors, which are highly compatible with the CMOS process. This prevents the number of steps from increasing and the manufacturing cost from increasing, as compared with when using bipolar transistors.

(6) The backgate of the transistor TN11 is coupled to the gate of the transistor TN11 via the resistor R2. Even when, for example, the potential difference between the voltage of the power supply terminal T1 and the voltage applied from the bus B1 to the output terminal To is greater than the gate-source breakdown voltage of the transistor TN11 (12 V in this example), this structure prevents a voltage equal to or higher than the breakdown voltage from being applied between the gate and the source of the transistor TN11. This prevents the transistor TN11 from being broken.

(7) The backgate of the transistor TP12 is coupled to the source of the transistor TP12 via the resistor R1. In this case, the resistor R1 is arranged on the current path formed when the source voltage of the transistor TP12 becomes lower than the potential at the power supply terminal T2. The resistance of the resistor R1 is controlled to reduce the amount of current flowing through the current path.

The above embodiments may be modified in the following forms.

Figure 9:
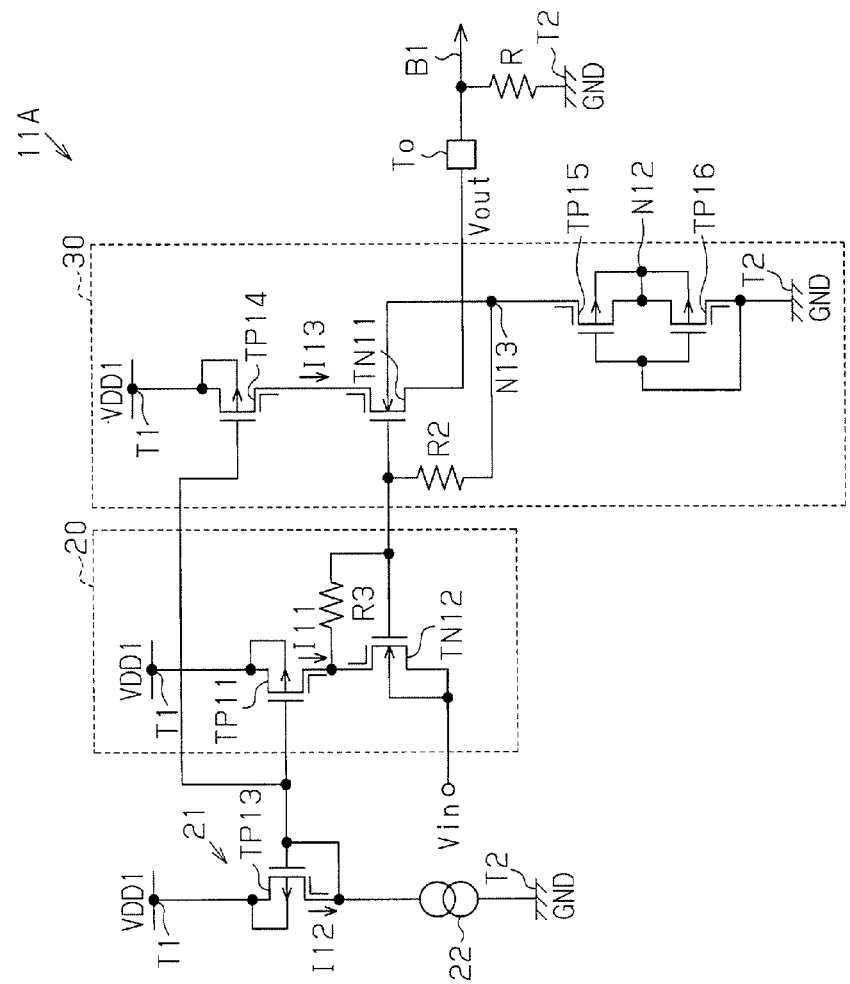
FIG. 9 is a circuit diagram of an output circuit according to a modification.

In the above embodiments, the coupling of the output transistors (the P-channel MOS transistor TP2 in FIG. 1 and the P-channel LDMOS transistor TP12 in FIG. 6) arranged in the buffer circuit 20 may be changed. For example, as illustrated in FIG. 9, an N-channel LDMOS transistor TN12 may replace the P-channel LDMOS transistor TP12 illustrated in FIG. 6. The transistor TN12 has a source provided with the input signal Vin. The transistor TN12 has a gate coupled to the gate of the transistor TN11, and a drain coupled to the drain of the transistor TP11. The transistor TN12 has a backgate coupled to the source of the transistor TN12. The gate of the transistor TN12 is coupled to the drain via a resistor R3, which functions as a second resistor.

The N-channel LDMOS transistor TN12 is of the same conductivity type as the N-channel LDMOS transistor TN11. In the present embodiment, the transistors TN11 and TN12 have the same element size so that the gate-source voltage Vgs1i of the transistor TN11 is the same as the gate-source voltage Vgs13 of the transistor TN12.

In the output circuit 11A illustrated in FIG. 9, when the input signal Vin is provided from the internal circuit to the source of the transistor TN12, the gate voltage of the transistor TN12 becomes higher than the input signal Vin by an amount corresponding to the gate-source voltage Vgs13 of the transistor TN12. The gate voltage of the transistor TN12 becomes the gate voltage of the transistor TN11. Thus, the output signal Vout output from the source of the transistor TN11 will be lower than the gate voltage of the transistor TN12 by an amount corresponding to the gate-source voltage Vgs11 of the transistor TN11. For example, the output signal Vout is expressed as $$Vout = Vin + Vgs13 - Vgs11.$$

In the present embodiment, the gate-source voltages Vgs11 and Vgs13 of the transistors TN11 and TN12 are set to be substantially the same. The transistors TN11 and TN12 are LDMOS transistors of the same conductivity type. This allows the gate-source voltages Vgs11 and Vgs13 of the transistors TN11 and TN12 to be set equally (Vgs11=Vgs13) with high accuracy even when there are manufacturing variations. As a result, the voltage value of the output signal Vout becomes the same level as the input signal Vin expressed by the following equation:

$$\begin{aligned} Vout &= Vin + Vgs13 - Vgs11 \\ &= Vin + Vgs13 - Vgs11 \\ &= Vin \end{aligned}$$

Further, the gate of the transistor TN12 is coupled to the drain of the transistor TN12 via a resistor R3. When the gate voltage of the transistor TN12 becomes lower than the source voltage of the transistor TN12, the current path from the gate of the transistor TN12 to its source includes the resistor R3. In detail, when the gate voltage of the transistor TN12 becomes lower than the source voltage of the transistor TN12, the transistor TN12 is turned off to form a parasitic diode between the drain and the backgate of the transistor TN12. The parasitic diode has a forward direction from the backgate of the transistor TN12 to its drain. Thus, the current path including the drain, the parasitic diode, and the source of the transistor TN12 is formed between the gate of the transistor TN12 and its source via the resistor R3. The current path includes the resistor R3. Controlling the resistance of the resistor R3 may thus reduce the amount of current to flow through the current path. For example, the output circuit 11A illustrated in FIG. 9 includes the resistor R3 having the resistance set to control the amount of current flowing through the current path to or below a value specified by standards such as the CAN or the LIN. The resistor R3, which is an example of the second resistor, may be omitted. Although FIG. 9 illustrates a modified example of the buffer circuit 20 of the second embodiment, the buffer circuit 20 of the first embodiment may also be modified in the same manner.

Figure 10:
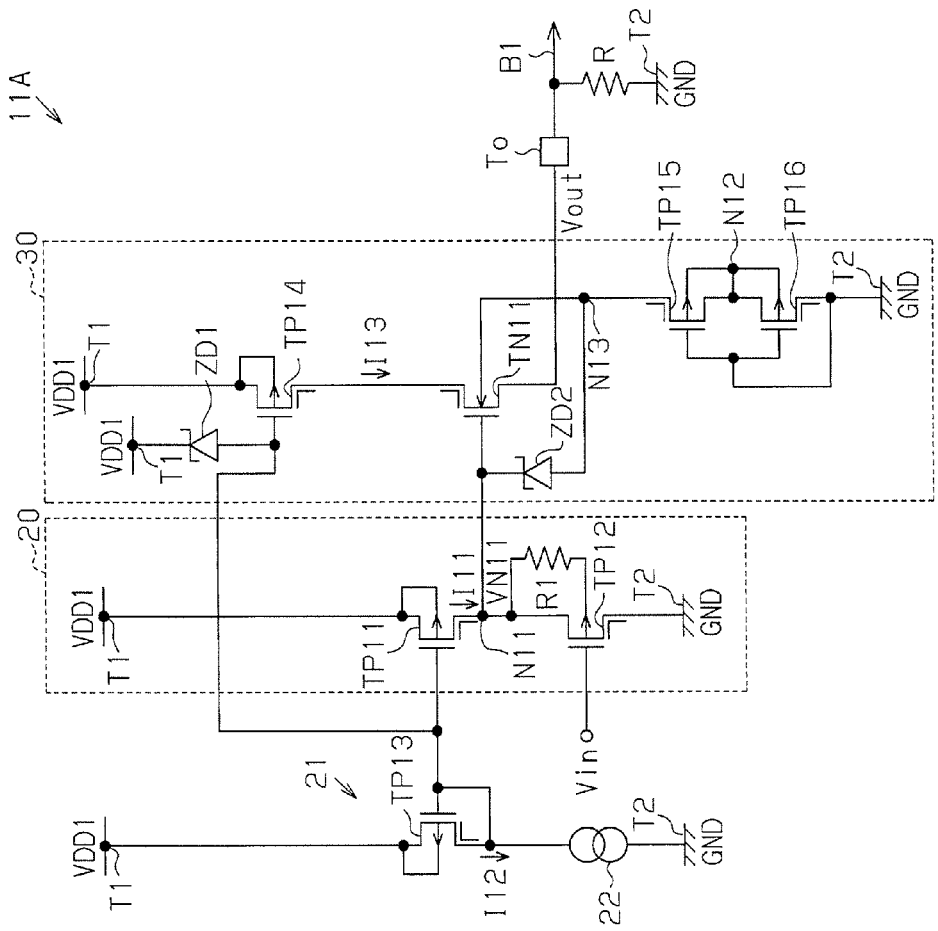
FIG. 10 is a circuit diagram of an output circuit according to another modification.
Figure 11:
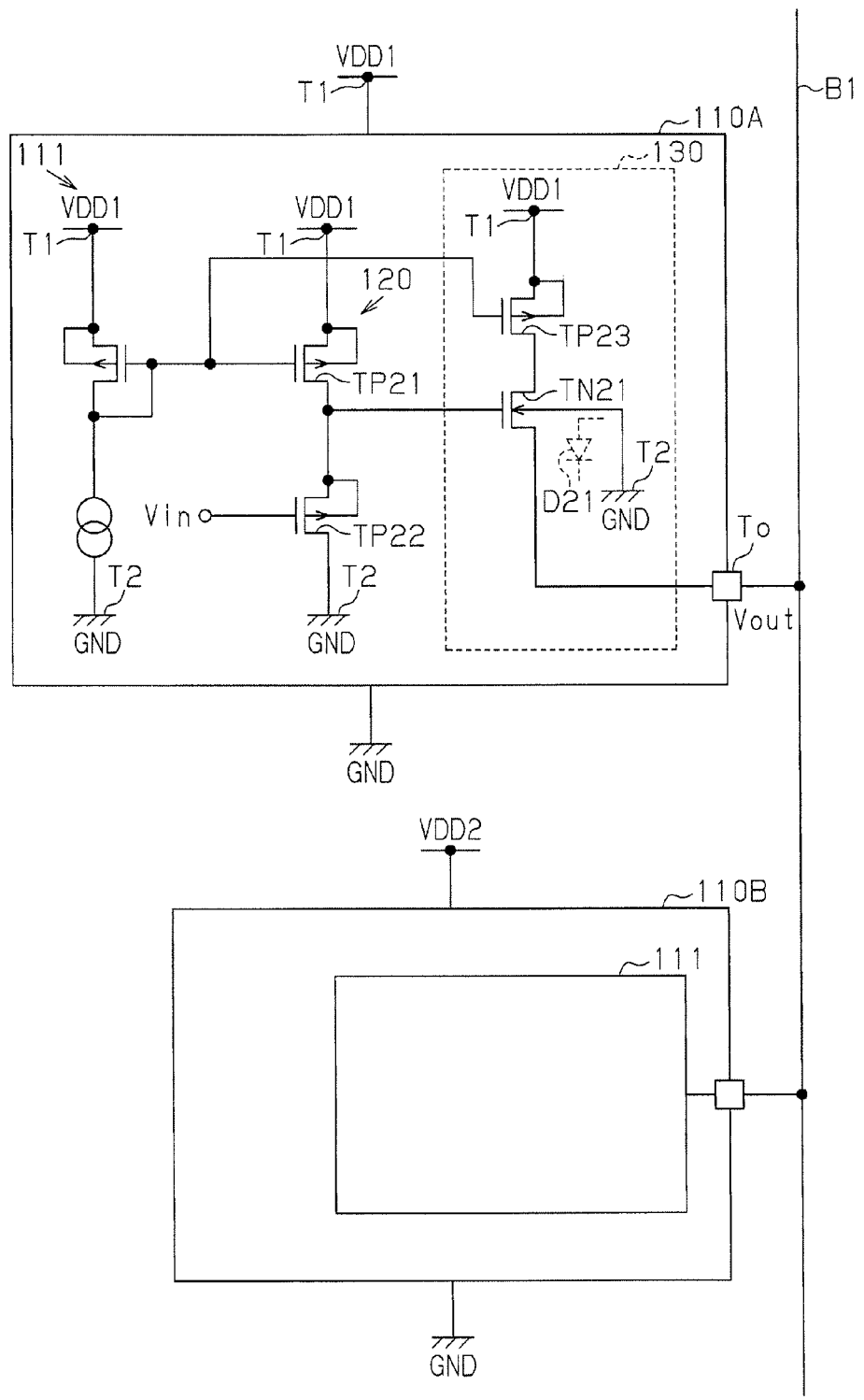
FIG. 11 is a circuit diagram of a referential example of a semiconductor integrated circuit device.

In the second embodiment, a Zener diode ZD2, which is illustrated in FIG. 10, may be arranged to replace the resistor R2, which is an example of the first resistor. For example, the Zener diode ZD2 arranged between the backgate and the gate of the transistor TN11 may have an anode coupled to the backgate (node N13) of the transistor TN11 and a cathode coupled to the gate (node N11) of the transistor TN11. Alternatively, the resistor R2 and the Zener diode ZD2 may be coupled in parallel.

The output circuit in each of the above embodiments includes the N-channel MOS transistor TN1 or the N-channel LDMOS transistor TN11 as an example of a first metal oxide semiconductor transistor. Alternatively, a P-channel MOS transistor or a P-channel LDMOS transistor may be arranged to function as the first metal oxide semiconductor transistor. In this case, the output circuit 11A illustrated in FIG. 1 or FIG. 6 may preferably include an N-channel MOS transistor or an N-channel LDMOS transistor instead of the P-channel MOS transistor TP2 or the P-channel LDMOS transistor TP12, which is an example of a fifth metal oxide semiconductor transistor. The output circuit 11A illustrated in FIG. 9 includes the N-channel LDMOS transistor TN12 as an example of a fourth metal oxide semiconductor transistor. When the P-channel MOS transistor or the P-channel LDMOS transistor is used as the first metal oxide semiconductor transistor, a P-channel MOS transistor or a P-channel LDMOS transistor is preferably used as the fourth metal oxide semiconductor transistor.

The output circuit of the first embodiment includes the P-channel LDMOS transistors TP5 and TP6 as examples of the second metal oxide semiconductor transistor and the third metal oxide semiconductor transistor. Alternatively, for example, N-channel MOS transistors may be used as the second metal oxide semiconductor transistor and the third metal oxide semiconductor transistor.

The output circuit of the second embodiment includes the P-channel MOS transistors TP15 and TP16 as examples of the second metal oxide semiconductor transistor and the third metal oxide semiconductor transistor. Alternatively, for example, N-channel LDMOS transistors may be used as the second metal oxide semiconductor transistor and the third metal oxide semiconductor transistor.

The output circuit of the first embodiment includes the P-channel MOS transistor TP4 as an example of a current source. Alternatively, the output circuit may include an N-channel MOS transistor as the current source.

The output circuit of the second embodiment includes the P-channel LDMOS transistor TP14 as an example of a current source. Alternatively, the output circuit may include an N-channel LDMOS transistor as the current source.

In the first embodiment, a Zener diode ZD1 may be arranged between the gate of the P-channel MOS transistor TP4 and the power supply terminal T1.

In the first embodiment, the backgate of the P-channel MOS transistor TP3 may be coupled to the source of the transistor TP3 via the resistor R1.

In the first embodiment, the backgate of the N-channel MOS transistor TN1 may be coupled to the gate of the transistor TN1 via the resistor R2. In this case, a Zener diode ZD2 may be arranged between the backgate and the gate of the transistor TN1. Alternatively, the resistor R2 and the Zener diode ZD2 may be coupled in parallel between the backgate and the gate of the transistor TN1.

As illustrated in FIG. 9, the Zener diode ZD1 illustrated in FIG. 6 may be omitted.

In the second embodiment, the resistor R1 may be omitted. In this case, the backgate of the P-channel LDMOS transistor TP12 is directly coupled to the source of the transistor TP12.

In the second embodiment, the resistor R2 functioning as an example of the first resistor may be omitted. In this case, the coupling between the backgate of the N-channel LDMOS transistor TN11 and the gate of the transistor TN11 is omitted.

The structure of the buffer circuit 20 is not limited to the internal structure described in each of the above embodiments. Also, the buffer circuit 20 may be omitted. In this case, the input signal Vin may be directly provided to the gates of the transistors TN1 and TN11.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An output circuit comprising:
   a current source and a first metal oxide semiconductor (MOS) transistor coupled in series between a high-potential power supply terminal and an output terminal;
   a second MOS transistor including a drain coupled to a backgate of the first MOS transistor; and
   a third MOS transistor including a source coupled to a source of the second MOS transistor,
   wherein backgates of the second MOS transistor and the third MOS transistor are coupled to the source of the second MOS transistor, and the backgates of the second MOS transistor and the third MOS transistor are in a floating condition,
   the first MOS transistor is an N-channel laterally diffused metal oxide semiconductor (LDMOS) transistor,
   each of the second MOS transistor and the third MOS transistor is a P-channel LDMOS transistor, and
   a drain of the third MOS transistor, and gates of the second and third MOS transistors are coupled to a low-potential power supply terminal.

2. The output circuit according to claim 1, wherein the backgate of the first MOS transistor is coupled to a gate of the first MOS transistor via a first resistor.

3. The output circuit according to claim 1, wherein each of the first MOS transistor, the second MOS transistor, and the third MOS transistor is a laterally double-diffused insulated gate MOS transistor.

4. The output circuit according to claim 1, further comprising a source-follower circuit that applies voltage in accordance with an input signal to a gate of the first MOS transistor, wherein:

the source-follower circuit includes a fourth MOS transistor of the same conductivity type as the first MOS transistor, and the fourth MOS transistor includes a source provided with the input signal, a drain coupled to a further current source that supplies current proportional to current supplied by the current source, and a gate coupled to the gate of the first MOS transistor.

5. The output circuit according to claim 4, wherein the fourth MOS transistor includes a gate coupled to the drain of the fourth MOS transistor via a second resistor.

6. The output circuit according to claim 4, wherein the first MOS transistor and the fourth MOS transistor are set to have the same element size.

7. The output circuit according to claim 1, further comprising a source-follower circuit that applies voltage in accordance with an input signal to the gate of the first MOS transistor, wherein:

the source-follower circuit includes a fifth MOS transistor of a conductivity type that differs from the first MOS transistor, and the fifth MOS transistor includes a gate provided with the input signal, a source coupled to the gate of the first MOS transistor, and a backgate coupled to the source of the fifth MOS transistor via a third resistor.

8. An output circuit comprising:

a current source and a first metal oxide semiconductor (MOS) transistor coupled in series between a power supply terminal and an output terminal;

a second MOS transistor including a drain coupled to a backgate of the first MOS transistor;

a third MOS transistor including a source coupled to a source of the second MOS transistor, wherein backgates of the second MOS transistor and the third MOS transistor are coupled to the source of the second MOS transistor, and the backgates of the second MOS transistor and the third MOS transistor are in a floating condition; and a Zener diode that includes a cathode coupled to a gate of the first MOS transistor and an anode coupled to the backgate of the first MOS transistor.

\* \* \* \* \*